(12) United States Patent
Mitic et al.

(10) Patent No.: US 7,566,490 B2
(45) Date of Patent: Jul. 28, 2009

(54) COMPOSITE MATERIAL AND BASE PLATE (75) Inventors: Gerhard Mitic, Munich (DE); Siegfried Ramminger, Munich (DE); Hans-Peter Degischer, Salzburg (AT); Thomas Licht, Warstein (DE)

(73) Assignee: Infineon Technologies AG, Munich (DE)

( * ) Notice: Subject to any disclaimer, the term of this patent is extended or adjusted under 35 U.S.C. 154(b) by 229 days.

(21) Appl. No.: 11/553,242

(22) Filed: Oct. 26, 2006

(65) Prior Publication Data

US 2007/0122587 A1 May 31, 2007

(30) Foreign Application Priority Data

Oct. 26, 2005 (DE) .................... 10 2005 051 269

(51) Int. Cl.
*B32B 15/04* (2006.01)
(52) U.S. Cl. .................... 428/293.1; 428/105; 165/185
(58) Field of Classification Search ............. 428/293.1, 428/86, 93, 113, 105, 408, 114; 165/185; 257/703, 406
See application file for complete search history.

(56) References Cited

U.S. PATENT DOCUMENTS

| 2,789,076 | A | * | 4/1957 | Frieder et al. .................. 428/86 |
| 3,574,107 | A | * | 4/1971 | Hurka .......................... 428/92 |
| 4,134,759 | A | * | 1/1979 | Yajima et al. .................. 419/17 |
| 4,364,331 | A | * | 12/1982 | Foenard ....................... 119/526 |
| 5,407,727 | A | * | 4/1995 | Newell ........................ 428/188 |
| 5,834,115 | A | * | 11/1998 | Weeks et al. ................. 428/370 |
| 6,355,340 | B1 | * | 3/2002 | Singh et al. ................ 428/312.8 |
| 6,469,381 | B1 | * | 10/2002 | Houle et al. ................. 257/707 |
| 6,837,306 | B2 | * | 1/2005 | Houle et al. ................. 165/185 |
| 7,169,465 | B1 | * | 1/2007 | Karandikar et al. ...... 428/312.8 |
| 7,195,951 | B2 | * | 3/2007 | Houle et al. ................. 438/106 |
| 7,399,521 | B2 | * | 7/2008 | Wang et al. .............. 428/293.1 |
| 7,407,836 | B2 | * | 8/2008 | Bayerer et al. .............. 438/127 |
| 2007/0122587 | A1 | * | 5/2007 | Mitic et al. .................. 428/105 |

FOREIGN PATENT DOCUMENTS

DE  WO 200701005 A1 * 1/2007
DE  WO 2007009868 A1 * 1/2007

* cited by examiner

*Primary Examiner*—N. Edwards
(74) *Attorney, Agent, or Firm*—Dicke, Billig & Czaja, PLLC (57) ABSTRACT A composite material and a base plate made of this composite material for mounting electrical components and for connecting these components to a cooling device is disclosed. In one embodiment, the composite material includes a matrix material and fibers embedded therein. The fibers have in this case an anisotropic, directionally optimized distribution in the matrix material, so that heat occurring in a locally confined area can be effectively distributed and dissipated. The material of the fibers includes SiC, highly graphitized carbon or diamond. The fibers are arranged in the matrix material in various fiber levels, the fibers in the upper fiber levels being oriented predominantly horizontally in relation to a reference area and the fibers in the lower fiber levels being oriented predominantly vertically in relation to the reference area.

19 Claims, 5 Drawing Sheets

COMPOSITE MATERIAL AND BASE PLATE

CROSS-REFERENCE TO RELATED APPLICATIONS

This Utility Patent Application claims priority to German Patent Application No. DE 10 2005 051 269.0 filed on Oct. 26, 2005, which is incorporated herein by reference.

BACKGROUND

The invention relates to a fiber-reinforced metal matrix composite material with directionally optimized heat distribution and heat conduction and also to a base plate which includes such a composite material for mounting electrical components and for removing the dissipated power produced by these components to a cooling device.

Electrical components of power electronics and microelectronics include diodes, IGBTs (Insulated Gate Bipolar Transistors) or integrated components which include a multiplicity of electrically interconnected individual components or integrated circuits. These are built up on base plates, which serve both for mechanical attachment and stabilization and for the removal of dissipated heat. With increasing integration and functionality and rising operating voltage, there is an increase in the dissipated power density, that is to say the heat output per unit area, that is produced by the components and has to be removed. Particularly the formation of "hot spots", that is to say small areas with a high dissipated power density, leads to great thermomechanical loading of the connection setup between the electrical components and the base plate, and consequently to a reduction in reliability. Consequently, the heat removal and heat distribution restrict the maximum attainable dissipated power density, and consequently the possible integration density of components.

Therefore, both the setting-up and connecting technique and the cooling technology are playing an ever more important role in the further development of power electronics and microelectronics. High dissipated power densities can only be cooled with great effort, by active cooling methods such as two-phase cooling or forced liquid cooling. It is therefore necessary to distribute the heat over a larger area and subsequently remove it to appropriate cooling media such as air, oil or water.

In the past, base plates made of ceramic, metals or composite materials, such as for example Cu, Al, $Al_2O_3$, AlN, Al—SiC, BeO, Cu—W or Cu—Mo, have been used for removing and distributing the dissipated heat. These materials have an isotropic thermal conductivity in the range from 27 W/m·K ($Al_2O_3$) to 400 W/m·K (Cu). For better removal of the dissipated power, a thermal conductivity of at least 600 W/m·K is desired for a composite material.

The high coefficients of thermal expansion of the previously used base plate materials in comparison with the material of the electrical component lead to stresses in the connection setup between components and the base plate, and consequently to a reduction in reliability.

To solve these problems, highly graphitized carbon fibers have been incorporated in various materials, such as for example C, Cu or Al, on a trial basis, for example by the company Applied Sciences Incorporated. In this case, the fibers had a diameter of several pm and a length of several mm and were isotropically distributed in the matrix material. Thermal conductivities of up to 910 W/m·K were achieved. Similarly, longer fibers and their integration in various materials are known. Methods of incorporating fibers in matrix materials are, for example, liquid phase infiltration, hot isostatic pressing (HIP) or the squeeze casting method.

However, composite materials with an anisotropic distribution, optimized with respect to the heat distribution, of fibers with a high thermal conductivity are still not commercially available or used.

A disadvantage of the isotropic distribution of the fibers in the material, of base plate materials for example, is the insufficient distribution over a large area of the peaks of dissipated heat occurring at "hot spots", which leads to stresses in the material itself and at the interfaces with other materials and to reduced reliability of the overall setup.

For these and other reasons, there is a need for the present invention.

SUMMARY

One embodiment provides a composite material and a base plate made of this composite material for mounting electrical components and for connecting these components to a cooling device. The composite material includes a matrix material and fibers embedded therein. The fibers have in this case an anisotropic, directionally optimized distribution in the matrix material, so that heat occurring in a locally confined area can be effectively distributed and dissipated. The material of the fibers includes SiC, highly graphitized carbon or diamond. The fibers are arranged in the matrix material in various fiber levels, the fibers in the upper fiber levels being oriented predominantly horizontally in relation to a reference area and the fibers in the lower fiber levels being oriented predominantly vertically in relation to the reference area.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4 illustrates a side view (FIG. 4A) and a plan view (FIG. 4B) of the composite material according to the invention in a first embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the present invention provides a composite material which makes it possible initially to distribute locally occurring heat effectively over a larger area and then remove it to a cooling medium of a cooling device by directing it through a material with a high thermal conductivity.

In another embodiment, the invention provides a base plate for mounting electrical components and for connecting these components to a cooling device which makes effective distribution and removal of high dissipated power densities of the electrical components possible.

The composite material according to the invention includes a matrix material and fibers embedded in it, these fibers having an anisotropic distribution in the matrix material. The fibers have a very high thermal conductivity in the longitudinal direction, but only a low thermal conductivity in the transverse direction. Consequently, the heat is removed in the direction determined by the orientation of the fibers. According to the invention, the fibers are now no longer isotropically distributed and oriented in the matrix material, but have a fixed, anisotropic orientation and arrangement, so that heat occurring in a locally confined area can be specifically distributed over a larger area and removed in a defined direction, for example toward a cooling device. A further advantage of the embedded fibers is the clear reduction in the coefficient of thermal expansion of the composite material. The specific distribution of the heat over a larger area, its directed removal and the reduced coefficient of thermal expansion have the effect of reducing the level of cyclical loading in the composite material and the adjacent connecting layers, and consequently the fatigue tendency, and of increasing the service life.

The material of the fibers includes SiC, highly graphitized carbon or diamond. These known fibers have a very high thermal conductivity in the longitudinal direction. Applied Sciences Incorporation specifies for example a thermal conductivity of 1950 W/m·K for such a fiber. The use of diamond fibers in embodiments still being developed is also conceivable.

The matrix material has a thermal conductivity of at least 100 W/m·K. A high thermal conductivity of the matrix material reduces stresses in the composite material on account of the differences in the coefficient of thermal expansion.

The matrix material of the composite material according to the invention includes Cu, Al, Ag, Pt or Au, since these materials have a very high thermal conductivity and favorable mechanical and chemical properties, such as for example mechanical strength and corrosion resistance.

The composite material according to the invention includes a number of fiber levels, the fibers in the upper fiber levels being oriented predominantly horizontally in relation to a first reference area and those in the lower fiber levels being oriented predominantly vertically in relation to the first reference area. Serving for example as the reference area is the surface of the material that is facing a heat source, the fiber levels being arranged parallel to the surface. The upper fiber levels are in this case located near the surface of the composite material that is facing the heat source. The lower fiber levels are located at a greater depth of the composite material, measured from the same surface of the composite material. This achieves initially an effective distribution of the heat over a larger area in the upper fiber levels, and after that directed removal of the heat, for example toward a cooling device, in the lower fiber levels.

At least one of the upper fiber levels includes straight fibers which extend over virtually the entire length of the composite material and, at least in certain portions, are arranged parallel to one another. The fibers are individually formed and, at least in some portions, may be spaced apart from one another or touch at least at a point. As a result, the heat produced is distributed along a fiber over the entire length of the composite material.

At least one of the upper fiber levels includes fibers which are incorporated in the material matrix as a continuous fiber in the form of a loop, the individual straight portions of the fiber being arranged parallel to one another, at least in certain portions, that is to say over part of the length of the straight fibers. The individual straight fiber portions may partly be spaced apart from one another or touch at least at a point. The high thermal conductivity in the longitudinal direction of the fiber has the effect that the heat is distributed uniformly over the entire area of the fiber level concerned.

At least one upper fiber level includes fibers which are arranged spirally. In this case, they run spirally outward from a center point.

Furthermore, at least one upper fiber level includes fibers which are straight and arranged radially. The fibers thereby form rays which cross at a center point ("hot spot").

The spiral or radial arrangement of the horizontally oriented fibers allows the heat to be removed particularly effectively from locations with only a small lateral extent, but high heat density, "hot spots", and to be distributed over a larger area.

However, other design possibilities for the form and arrangement of the fibers within a fiber level, which can be adapted to the respective requirements, are possible and conceivable. In particular, fibers can be incorporated in a fiber level with a different arrangement and horizontal alignment. For example, both straight fibers and spiral fibers may be arranged in one fiber level or even be connected to one another.

Further embodiments of the composite material according to the invention are obtained by the arrangement of differently designed upper fiber levels one over the other, making it possible for the heat to be uniformly distributed over the entire area of the composite material.

The straight, parallel running fibers or fiber portions of a continuous fiber in at least two of the upper fiber levels are arranged at angles deviating from one another in relation to a first reference direction. This reference direction may for example be an edge of the surface of the composite material. Consequently, uniform heat distribution over a large area is achieved over several fiber levels.

The fibers in at least one of the upper fiber levels are arranged at an angle of 0° in relation to a first reference direction and the fibers in at least one other of the upper fiber levels are arranged at an angle of 90° in relation to the first reference direction.

Furthermore, the fibers in at least one of the upper fiber levels are arranged at an angle of 0°, the fibers in at least a second of the upper fiber levels are arranged at an angle of 60° and the fibers in at least a third of the upper fiber levels are arranged at an angle of −60° in relation to the first reference direction.

The fibers in at least one of the upper fiber levels are arranged at an angle of 0°, the fibers in at least a second of the upper fiber levels are arranged at an angle of 45°, the fibers in at least a third of the upper fiber levels are arranged at an angle of −45° and the fibers in at least a fourth of the upper fiber levels are arranged at an angle of 90° in relation to the first reference direction.

At least one of the upper fiber levels includes fibers oriented differently with respect to a first reference direction, which are connected to one another in the manner of a woven fabric. In this case, the fibers may have different angles in relation to one another. The heat can then be passed on via the linkage points to other fibers that are not directly connected to the location where heat is produced, and can consequently be distributed uniformly over the entire area of the fiber level.

The fibers of the woven fabric in one fiber level are arranged perpendicularly in relation to one another.

However, other arrangements and linkages of fibers in a woven fabric are also possible.

The composite material contains in the upper or lower fiber levels fibers that have their ends connected directly to fibers in the other respective fiber levels. In other words: ends of fibers in the upper fiber levels may be connected directly to fibers of the lower fiber levels and ends of fibers of the lower fiber levels may be connected directly to fibers of the upper fiber levels. Consequently, a good transition is achieved from the horizontally occurring distribution of the heat to its vertically occurring removal to a cooling device.

The upper and lower fiber levels overlap and thereby form a region in which they gradually merge with one another. This gradual transition reduces the mechanical stresses in the composite material and consequently increases its reliability.

The gradual transition is achieved by the lower fiber levels containing fibers which form loops, and these loops overlap with the fibers of the upper fiber levels. In this case, the horizontal extents of the loops with which the vertical fibers of the lower fiber levels overlap the upper fiber levels increase the heat distributing effect of the upper fiber levels.

Additional short fibers are incorporated in the lower fiber levels, filling the spaces between the fibers connected to the upper fiber levels up to a maximum volume fraction of 90%. These fibers increase the thermal conductivity of the lower fiber levels, and consequently lead to improved removal of the distributed heat.

The fraction of fibers in a fiber level that are oriented in the same direction is approximately 70% of the volume of the composite material in this fiber level. The maximum achievable volume fraction of all the fibers in a fiber level is approximately 90%.

The total thickness of the upper fiber levels is approximately 0.1 to 1 mm.

However, other design possibilities, which can be adapted to the heat removal requirements and other boundary conditions, are also conceivable, both in the form of the composite material as a whole and in the thickness of the upper fiber levels.

The length of the fibers is several tenths of a mm to several m. It is therefore possible to use short fibers of 0.1 to 0.9 mm in length, continuous fibers with a length of greater than 10 m, and fibers of any length in between. A person skilled in the art must choose the length of the fibers to be appropriate for the respective arrangement of the fibers in a fiber level. Furthermore, the length of the fibers in the composite material, specifically the continuous fibers, is dependent on the dimensions of the composite material.

The fibers have a diameter of 1 to 200 μm, typical diameters being dependent on the material of the fibers. For example, typical diameters for carbon fibers are 1 to 20 μm and for SiC fibers up to 200 μm. Fibers with a small diameter can be processed well, that is to say for example linked together to form a woven fabric, while large diameters of the fibers ensure very high thermal conductivity. The fibers may also be used in a mixed form as hybrid fiber arrangements.

The base plate according to the invention for mounting electrical components and for connecting these components to a cooling device includes a composite material according to the invention as claimed in patent claims 1 to 19. The upper fiber levels are in this case arranged near the side of the base plate that is facing the electrical components and the lower fiber levels are arranged near the side of the base plate that is facing the cooling device. The effective distribution and specific removal of the power dissipated by the components reduces the thermomechanical loading of the connection setup between the components and the base plate, and consequently leads to a reduction in the fatigue tendency and an increase in reliability. Furthermore, a greater maximum permissible dissipated power density, and consequently further integration of components, is made possible by the better distribution and removal of the heat.

The base plate according to the invention has a thickness of 3 to 10 mm, a typical thickness, for example for base plates in power electronics or microelectronics, being 5 mm.

Figure 1:
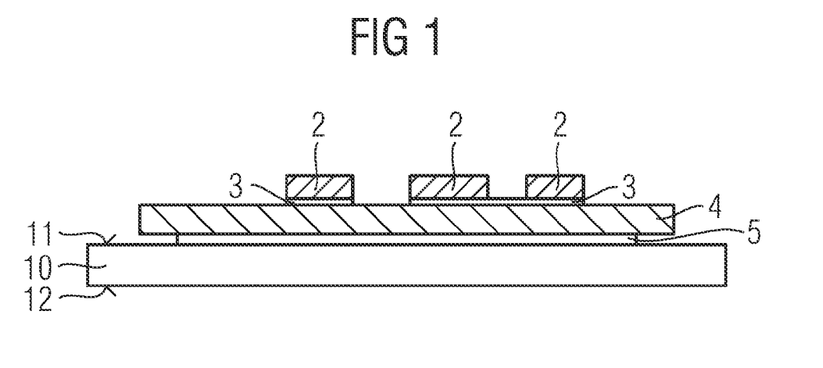
FIG. 1 illustrates a schematic representation of the setup of a module which includes electrical components and a base plate.

In FIG. 1, the setup of a module which includes electrical components 2 and a base plate 10 is schematically represented. The electrical components 2, which may for example also include integrated circuits, are applied to the substrate 4 by means of a first connecting layer 3, which may be electrically conducting or non-conducting. The substrate 4 contains interconnects or other electrically conductive connections, which make it possible for the components 2 to be electrically connected to the outside. The substrate 4 is attached on the upper side 11 of the base plate 10 by means of a second connecting layer 5. The underside 12 of the base plate 10 is connected to a cooling device (not represented here) in such a manner that heat can be removed from the base plate 10 to the cooling device.

Figure 2:
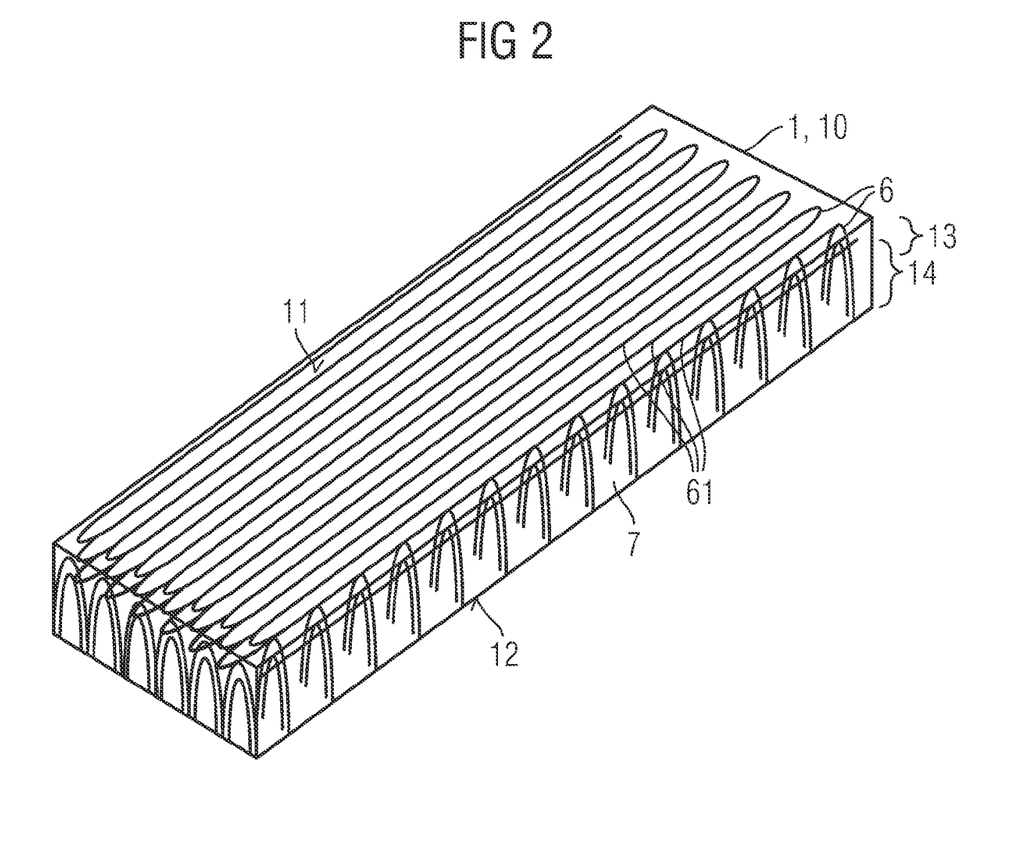
FIG. 2 illustrates a perspective representation of the setup of the composite material according to the invention in a first embodiment.

FIG. 2 illustrates a perspective representation of the setup of the composite material 1 according to the invention in a first embodiment. Here, the composite material 1 has the form of a base plate 10. However, a wide variety of outer forms of the composite material 1 are possible.

Fibers 6 of highly graphitized carbon or SiC are embedded in the matrix material 7 of the composite material 1, oriented predominantly horizontally in the upper fiber levels 13, that is to say the fibers are arranged parallel to the upper side 11 of the composite material 1. On the other hand, the fibers 6 in the lower fiber levels 14 are oriented predominantly vertically in relation to the upper side 11 of the composite material 1 and extend over the entire volume of the fiber levels 14 of the composite material 1. The upper side 11 serves as the first reference area for the definition of the alignment of the fibers 6 in the fiber levels 13 and 14. However, the underside 12 or any other area that is aligned parallel to the upper side 11 or the underside 12 of the composite material 1 may also serve as the reference area.

In the embodiment represented here, the fibers 6 in the upper fiber levels 13 take the form of continuous fibers, which are embedded in the matrix material 7 in the form of loops, so that the straight portions 61 of the fibers 6 are arranged parallel to one another and are spaced apart from one another.

Figure 5A:
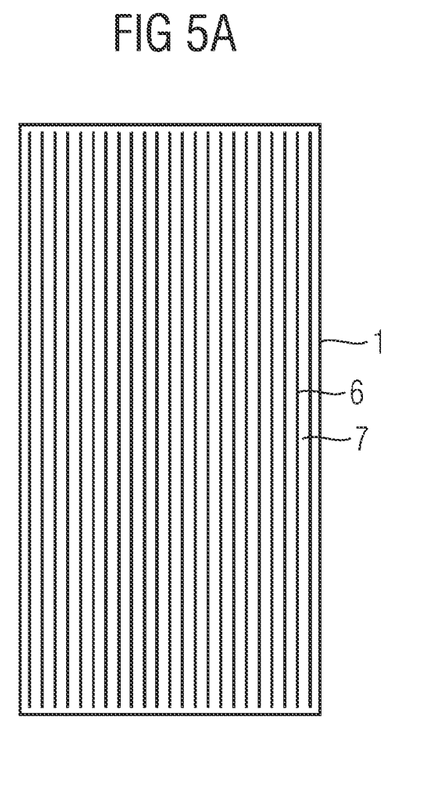
FIG. 5 illustrates a plan view of further embodiments of the composite material according to the invention.

However, the fibers 6 in the upper fiber levels 13 may also be formed individually and embedded in the matrix material 7 without loops, as represented in FIG. 5A. The fibers 6 in the lower fiber levels 14 are likewise in the form of loops and overlap partly with the upper fiber levels 13. The gradual transition between the levels 13, which serve for distributing the heat over a large area, and the levels 14, which serve for removing the heat to the cooling device, has the effect that mechanical stresses in the matrix material 7 are reduced.

Figure 3:
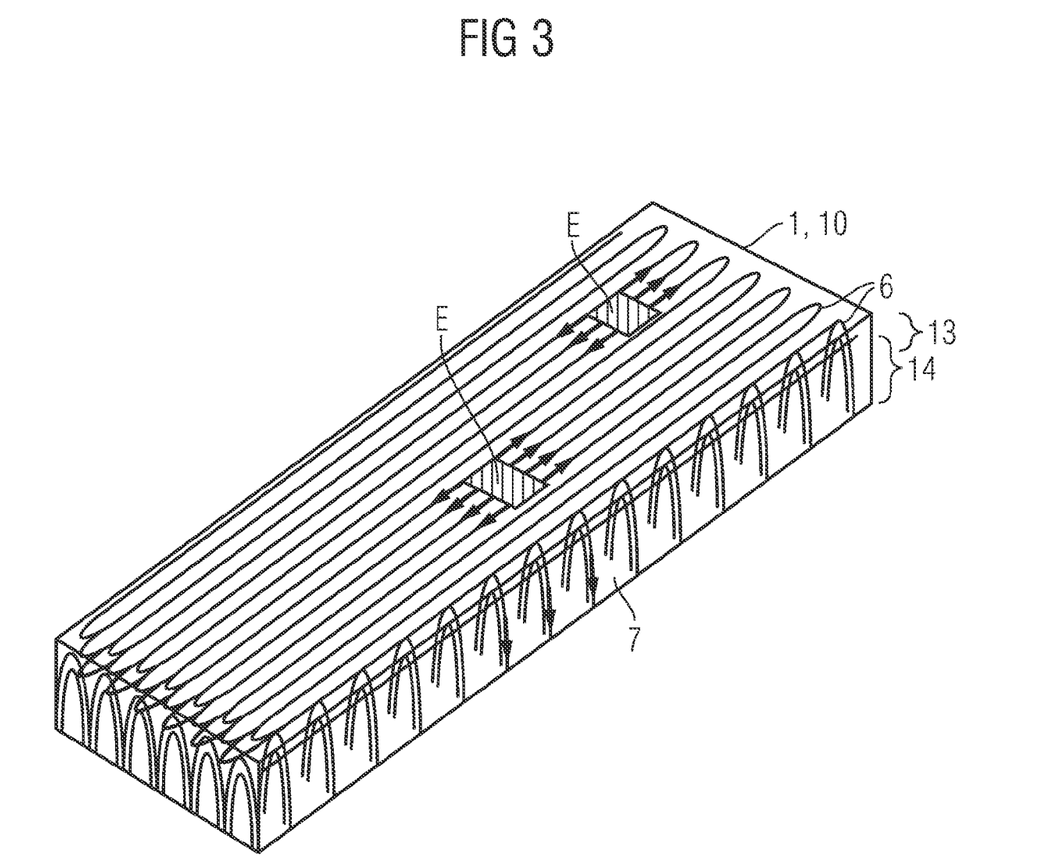
FIG. 3 illustrates a schematic representation of the heat distribution and heat conduction in the composite material according to the invention in a first embodiment.

To illustrate the various functions of the fiber levels 13 and 14, by way of example the directions of the heat transport are represented in FIG. 3 by arrows. In the upper fiber levels 13, the heat is initially removed along the fibers 6 in a horizontal plane away from the locations E where it is produced, and consequently distributed over a larger area. The overlapping loops of the lower fiber levels 14 have the effect that the heat is then transported vertically in the direction of the underside 12 of the composite material 1 and given off there to the filling device.

Figure 4A:
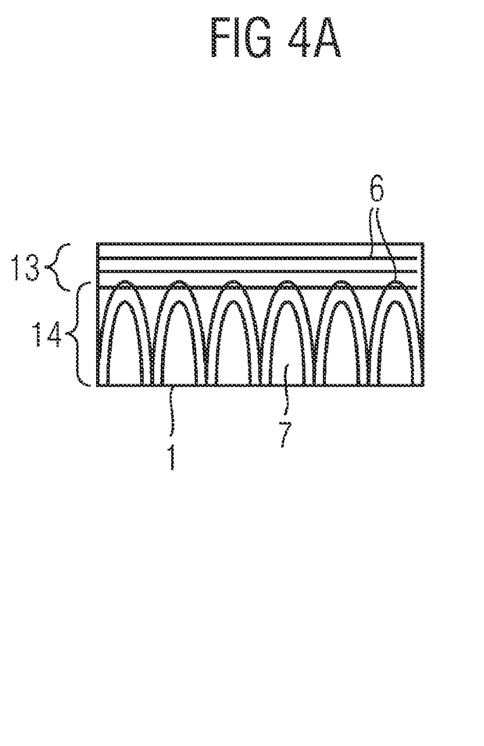
Figure 4B:
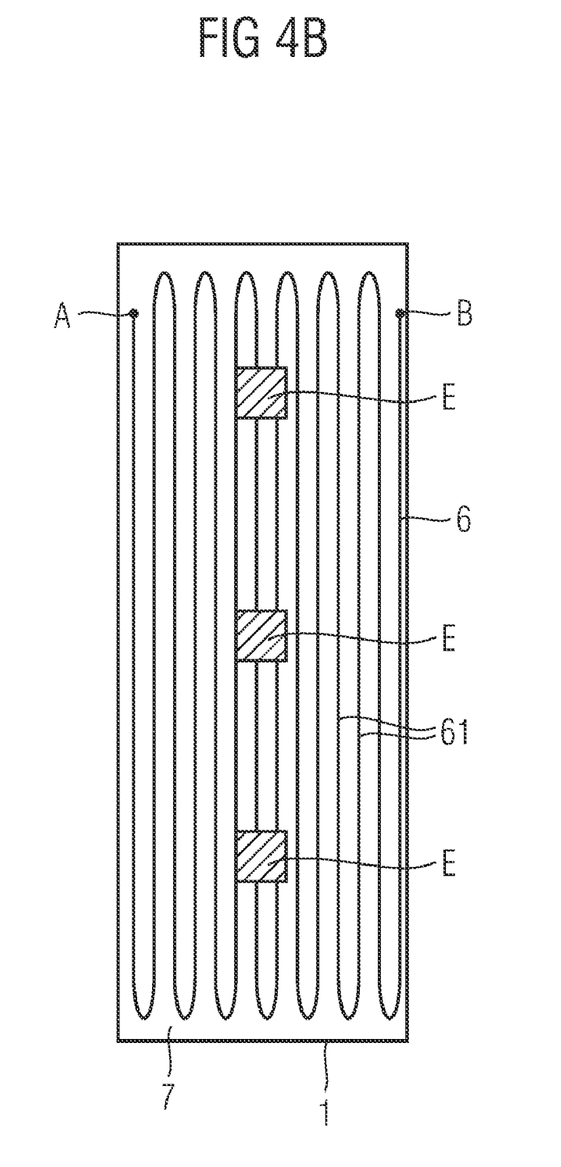

FIG. 4A illustrates a side view of the embodiment of the composite material according to the invention that is respectively represented in FIG. 2, while FIG. 4B illustrates the plan view of this embodiment. In FIG. 4A, the horizontally running fibers 6 in the upper fiber levels 13 and the vertically running fibers 6 in the lower fiber levels 14 can be clearly distinguished. The region in which the upper and lower fiber levels 13 and 14 overlap can likewise be clearly seen. In the plan view, represented in FIG. 4B, the loop form of the continuous fibers 6 in the upper fiber levels 13 is illustrated, the continuous fibers 6 beginning at the point A and ending at the point B. The straight portions 61 of the fibers 6 are thereby arranged parallel to one another.

FIG. 5 illustrates further embodiments of the composite material 1 according to the invention in plan view. In FIG. 5A, the fibers 6 in the upper fiber levels 13 are configured in such a way that they are straight and separate from one another and are arranged in parallel. Consequently, the continuous fiber of the first exemplar embodiment is replaced by individual, spaced-apart fibers 6, which run in a straight line and parallel to one another and extend over virtually the entire length of the composite material 1.

Figure 5B:
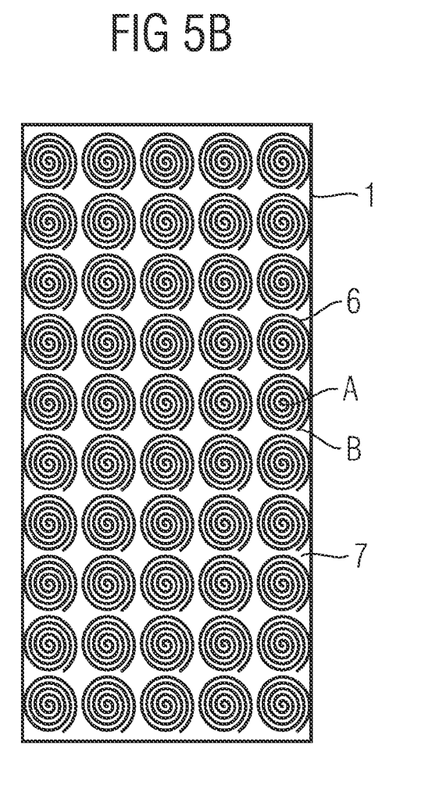
Figure 5C:
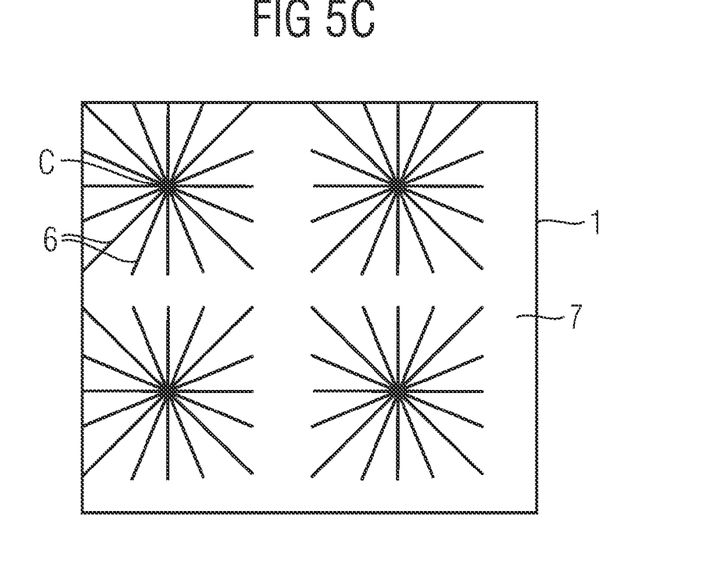

FIGS. 5B and 5C illustrate two other embodiments of the composite material 1 according to the invention, which are particularly suitable for removing the heat from many, closely packed locations where dissipated heat is produced, with in each case only a small lateral extent, "hot spots".

In this case, the heat distribution in the embodiment illustrated in FIG. 5B respectively takes place through a fiber 6, which leads from a starting point A in the form of a spiral to an end point B. In the case of the embodiment illustrated in FIG. 5C, a number of straight fibers 6 cross in a region around a central point C and thereby take a radial form which resembles the system of spokes of a wheel.

The ends of the horizontally oriented fibers 6 in the upper fiber levels 13 may for example be connected directly to vertically oriented fibers 6 of the lower fiber levels 14 and the heat removal to the cooling device is consequently further improved.

Figure 5D:
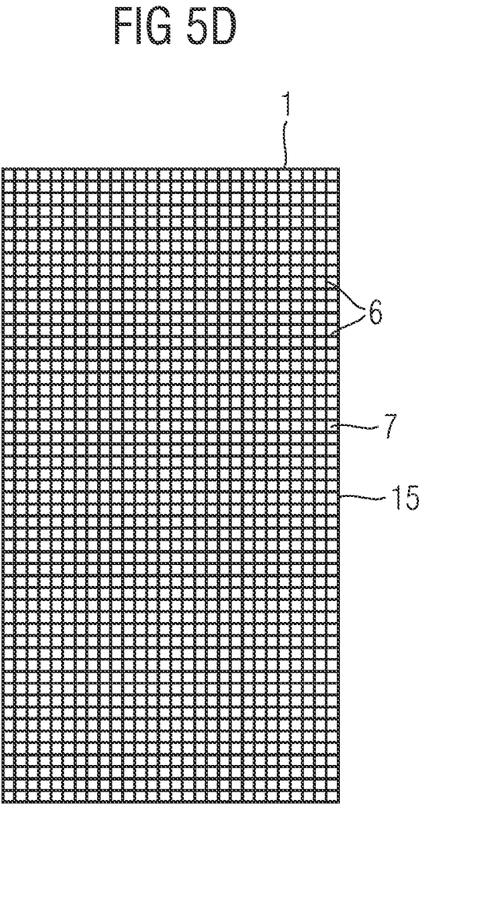
Figure 5E:
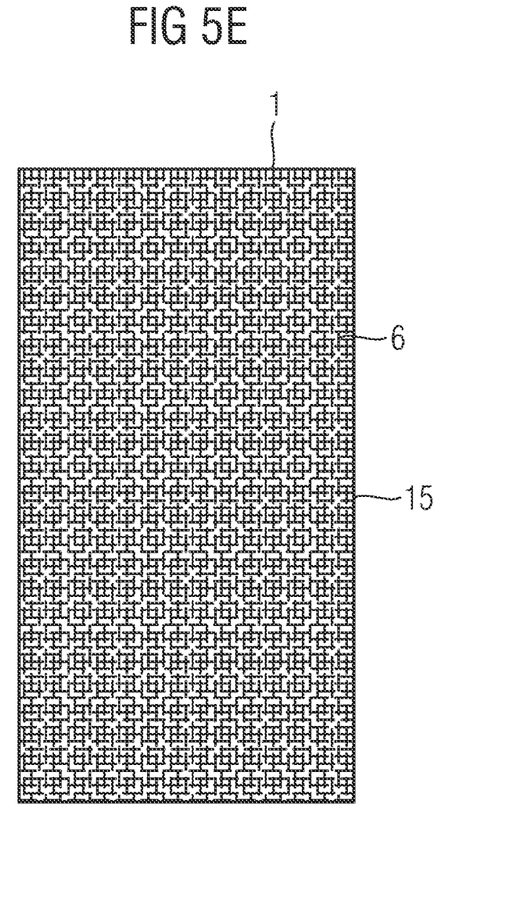

Further embodiments are provided by the arrangement of differently designed upper fiber levels 13 over one another or the linking of differently oriented fibers 6 in an upper fiber level 13 in the manner of a woven fabric. In this case, it is possible for example for fiber levels 13 with fibers 6 that have an angle of 0° in relation to a lateral edge 15 of the composite material 1 to be arranged alternately with fiber levels 13 with fibers 6 that have an angle of 90° in relation to the same lateral edge 15 (FIG. 5D). If fibers 6 which have an orientation such as that described in FIG. 5D are linked with one another in one fiber level, a woven fabric is created (FIG. 5E).

Many further embodiments of the composite material 1 according to the invention are possible, based on different arrangements of fiber levels 13 and 14, different orientations of the fibers 6 in the individual fiber levels 13, different linkages of fibers 6 in an upper fiber level 13 or different connections of the horizontally oriented fibers 6 of the upper fiber levels 13 to the vertically oriented fibers 6 of the lower fiber levels 14. These cannot be represented here in their entirety, but can be carried out and adapted to the respective requirements by a person skilled in the art, for example adapted to the lateral distribution of the dissipated power density over the entire area of the base plate 10.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A composite material, comprising:
   a metal matrix material;
   highly heat conductive fibers embedded in the matrix material; and
   wherein the composite material comprises a number of upper and lower fiber levels, wherein the upper fiber levels are located near a first surface of the composite material and the lower fiber levels are located at a greater depth of the composite material, the depth measured from the first surface, and wherein the fibers in the upper fiber levels are oriented predominantly horizontally in relation to the first surface and the fibers in the lower fiber levels are oriented predominantly vertically in relation to the first surface.

2. The composite material as claimed in claim 1, wherein at least one upper fiber level comprises fibers which are straight, extend over virtually the entire length of the composite material and, at least in certain portions, are arranged parallel to one another.

3. The composite material as claimed in claim 1, wherein at least one upper fiber level comprises fibers which are incorporated in the material matrix as a continuous fiber in the form of a loop, the individual straight portions of the fiber being arranged parallel to one another, at least in certain portions.

4. The composite material as claimed in claim 1, wherein at least one upper fiber level comprises fibers which are spirally arranged, beginning at a starting point.

5. The composite material as claimed in claim 1, wherein at least one upper fiber level comprises fibers which are straight and arranged radially in such a manner that they cross one another at a center point like crossing rays.

6. The composite material as claimed in claim 2, comprising wherein the fibers in at least two of the upper fiber levels are arranged at angles deviating from one another in relation to a first reference direction.

7. The composite material as claimed in claim 6, comprising wherein the fibers in at least one of the upper fiber levels are arranged at an angle of 0° in relation to the first reference direction and the fibers in at least one other of the upper fiber levels are arranged at an angle of 90° in relation to the first reference direction.

8. The composite material as claimed in claim 6, comprising wherein the fibers in at least one of the upper fiber levels are arranged at an angle of 0°, the fibers in at least a second of the upper fiber levels are arranged at an angle of 60° and the fibers in at least a third of the upper fiber levels are arranged at an angle of −60° in relation to the first reference direction.

9. The composite material as claimed in claim 6, wherein the fibers in at least one of the upper fiber levels are arranged at an angle of 0°, the fibers in at least a second of the upper fiber levels are arranged at an angle of 45°, the fibers in at least a third of the upper fiber levels are arranged at an angle of −45° and the fibers in at least a fourth of the upper fiber levels are arranged at an angle of 90° in relation to the first reference direction.

10. The composite material as claimed in claim 1, wherein at least one upper fiber level comprises fibers oriented differently with respect to a first reference direction, which are connected to one another in the manner of a woven fabric.

11. The composite material as claimed in claim 10, wherein the fibers of the woven fabric are arranged perpendicularly in relation to one another.

12. The composite material as claimed in claim 1, wherein the composite material comprises in the upper or lower fiber levels fibers that have their ends connected directly to fibers in the other respective fiber levels.

13. The composite material as claimed in one of claims 12, wherein the upper and lower fiber levels gradually merge with one another.

14. The composite material as claimed in claim 13, wherein the lower fiber levels comprise fibers which form loops and these loops overlap with the fibers of the upper fiber levels.

15. The composite material as claimed in one of claims 14, wherein additional vertical short fibers are incorporated in the lower fiber levels, filling the spaces between the fibers connected to the upper fiber levels in such a manner that the fraction of the parallel running fibers in the lower fiber level is at most 90% of the volume of the composite material.

16. The composite material as claimed in claim 1, comprising wherein the fraction of fibers in a fiber level that are oriented in the same direction is approximately 70% of the volume of the composite material in this fiber level.

17. The composite material as claimed in claim 1, comprising wherein the total thickness of all the upper fiber levels is approximately 0.1 to 1 mm.

18. The composite material as claimed in claim 1, comprising wherein the length of the fibers is 0.1 mm to several m.

19. The composite material as claimed in claim 1, comprising wherein the fibers have a diameter of 1 to 200 μm.

\* \* \* \* \*